United States Patent
Satake et al.

(10) Patent No.: US 9,459,416 B2
(45) Date of Patent: Oct. 4, 2016

(54) PACKAGE FOR HOUSING OPTICAL SEMICONDUCTOR ELEMENT AND OPTICAL SEMICONDUCTOR DEVICE

(71) Applicant: KYOCERA Corporation, Kyoto-shi, Kyoto (JP)

(72) Inventors: Takeo Satake, Kyoto (JP); Daisuke Tanaka, Kyoto (JP); Daisuke Sakumoto, Kyoto (JP)

(73) Assignee: Kyocera Corporation, Kyoto-shi, Kyoto (JP)

( * ) Notice: Subject to any disclaimer, the term of this patent is extended or adjusted under 35 U.S.C. 154(b) by 13 days.

(21) Appl. No.: 14/417,200

(22) PCT Filed: Jan. 28, 2014

(86) PCT No.: PCT/JP2014/051789
§ 371 (c)(1),
(2) Date: Jan. 26, 2015

(87) PCT Pub. No.: WO2014/119550
PCT Pub. Date: Aug. 7, 2014

(65) Prior Publication Data
US 2015/0205059 A1    Jul. 23, 2015

(30) Foreign Application Priority Data
Jan. 29, 2013 (JP) ................. 2013-013925

(51) Int. Cl.
*G02B 6/42* (2006.01)
*H01S 5/022* (2006.01)

(52) U.S. Cl.
CPC ........... *G02B 6/4248* (2013.01); *G02B 6/4251* (2013.01); *G02B 6/4256* (2013.01); *G02B 6/4257* (2013.01); *H01S 5/02216* (2013.01); *G02B 6/426* (2013.01); *H01S 5/02284* (2013.01)

(58) Field of Classification Search
None
See application file for complete search history.

(56) References Cited

U.S. PATENT DOCUMENTS

| | | | | |
|---|---|---|---|---|
| 4,119,363 A | * | 10/1978 | Camlibel | G02B 6/4202 164/80 |
| 4,752,109 A | * | 6/1988 | Gordon et al. | G02B 6/4204 257/712 |
| 6,318,910 B1 | * | 11/2001 | Higashikawa | G02B 6/4248 385/94 |

(Continued)

FOREIGN PATENT DOCUMENTS

| | | | | |
|---|---|---|---|---|
| EP | 0514213 B1 | * | 12/1998 | H01L 21/50 |
| JP | 11064689 A | * | 3/1999 | |
| JP | 2007-58133 A | | 3/2007 | |
| JP | 2010-62181 A | | 3/2010 | |
| JP | 2010-80562 A | | 4/2010 | |
| JP | 2010080562 A | * | 4/2010 | |
| JP | 2011-44695 A | | 3/2011 | |
| JP | 2011044695 A | * | 3/2011 | |
| JP | 2011-243856 A | | 12/2011 | |

OTHER PUBLICATIONS

International Search Report, PCT/JP2014/051789, Date of Mailing: Feb. 25, 2014, 2 pgs.

*Primary Examiner* — Michelle R Connelly
(74) *Attorney, Agent, or Firm* — Volpe and Koenig, P.C.

(57) ABSTRACT

A package for housing an optical semiconductor element includes a base body having an optical semiconductor element mounting portion on an upper main surface thereof; a frame body joined to the base body so as to surround the mounting portion; and an optical fiber securing member fitted in a through hole which penetrates through the frame body. The frame body is formed by bending a single strip-like plate member at its several positions, and then bonding one end side and an other end side thereof, the through hole being provided so as to be located at a juncture of the one end side and the other end side.

7 Claims, 2 Drawing Sheets

(56) References Cited

U.S. PATENT DOCUMENTS

| | | | |
|---|---|---|---|
| 6,797,989 B2* | 9/2004 | Bendelli | G02B 6/4201 257/422 |
| 2002/0027231 A1* | 3/2002 | Okada et al. | H01L 27/14618 257/118 |
| 2004/0022501 A1* | 2/2004 | Lam et al. | G02B 6/4248 385/92 |
| 2004/0141697 A1* | 7/2004 | Hubner | G02B 6/4201 385/92 |
| 2004/0228587 A1* | 11/2004 | Shinkai | G02B 6/4201 385/92 |
| 2004/0252953 A1* | 12/2004 | Crane, Jr. | G02B 6/3839 385/92 |
| 2013/0128489 A1* | 5/2013 | Satake | H01L 23/057 361/820 |

* cited by examiner

PACKAGE FOR HOUSING OPTICAL SEMICONDUCTOR ELEMENT AND OPTICAL SEMICONDUCTOR DEVICE

TECHNICAL FIELD

The present invention relates to a package for housing an optical semiconductor element, and an optical semiconductor device.

BACKGROUND ART

An example of a conventional hermetic package (hereafter also referred to simply as "package") is shown in FIGS. 3A and 3B (refer to Patent Literature 1, for example). FIG. 3A is a front view of the package, and FIG. 3B is a sectional view taken along the line A-A shown in FIG. 3A. In the figures, reference numeral 21 represents a base body, and reference numeral 22 represents a frame body. The base body 21 is made of a metal having good thermal conductivity such as copper-tungsten for example, and, the frame body 22, which is made of a metal such as an iron (Fe)-nickel (Ni)-cobalt (Co) alloy, is disposed in upstanding condition at the outer periphery of the upper main surface of the base body 21. The frame body 22 is attached to the base body 21 by means of brazing with a brazing material such as Ag (silver) solder, or otherwise.

The frame body 22 is fabricated by bending a strip-like metal plate at right angles with respect to its lengthwise direction into a frame shape, butting both end faces of the strip-like metal plate bent in a frame shape within a plane of one side wall, and hermetically bonding the end faces together. A juncture 22a is created when the hook-like or straight end faces are butt-joined to each other, with a brazing material such as Ag solder sandwiched between them, by application of heat.

Moreover, in Patent Literature 1, a concave recess 22b is formed in tandem with the juncture 22a on the outer peripheral wall surface of the frame body 22 in the vicinity of the juncture 22a, and also a convex projection 22c is formed on the inner wall surface thereof opposed to the recess 22b of the outer peripheral wall surface. The recess 22b and the projection 22c act to disperse a tensile stress developed in the frame body 22 due to the difference in thermal expansion coefficient between the frame body 22 and the base body 21, whereby portions forming the juncture 22a can be prevented, to some extent, from being detached each other.

CITATION LIST

Patent Literature

Patent Literature 1: Japanese Unexamined Patent Publication JP-A 2010-62181

SUMMARY OF INVENTION

Technical Problem

However, as a problem that exists in the conventional package, extra time and effort are required to put and bond the opposite end faces together.

The invention has been devised in view of the problem as mentioned above, and accordingly an object of the invention is to provide a readily-assembled package for housing an optical semiconductor element, and an optical semiconductor device.

Solution to Problem

A package for housing an optical semiconductor element in accordance with one embodiment of the invention includes: a base body having an optical semiconductor element mounting portion on an upper main surface thereof; a frame body joined to the base body so as to surround the mounting portion; and an optical fiber securing member fitted in a through hole which penetrates through the frame body. The frame body is formed by bending a single strip-like plate member at its several positions, and then bonding one end side and the other end side thereof, and, the through hole is provided so as to be located at a juncture of the one end side and the other end side.

Moreover, in the above-described package for housing an optical semiconductor element, it is preferable that a joining material is continuously interposed in both of the juncture of the frame body and a region between an outer peripheral surface of the optical fiber securing member, and the one end side and the other end side.

Moreover, in the above-described package for housing an optical semiconductor element, it is preferable that a part of the juncture of the frame body which extends from the through hole toward the base body is longer than a part of the juncture of the frame body which is located above the through hole.

Moreover, in the above-described package for housing an optical semiconductor element, it is preferable that a marking indicating a position coinciding with the juncture is provided on the outer peripheral surface of the optical fiber securing member.

Moreover, in the above-described package for housing an optical semiconductor element, it is preferable that a seal ring is joined to an upper surface of the frame body.

Moreover, in the above-described package for housing an optical semiconductor element, it is preferable that a groove which straddles the juncture is provided in a part of the seal ring which part is bonded to the juncture.

An optical semiconductor device in accordance with one embodiment of the invention includes: any one of the package for housing an optical semiconductor element as set forth hereinabove; an optical semiconductor element mounted on the mounting portion; and a lid body attached to an upper surface of the frame body so as to close an interior of the frame body.

Advantageous Effects of Invention

According to the package for housing an optical semiconductor element in accordance with one embodiment of the invention, a through hole is formed so as to be located at a juncture of one end side and the other end side of the frame body, and, the optical fiber securing member is fitted in the through hole in the frame body made by bending a single strip-like plate member at its several positions. Since the through hole serves also as a mounting hole for the installation of the optical fiber securing member, it is possible to reduce the number of process steps for assembly. Moreover, by interposing the optical fiber securing member between the to-be-bonded surfaces of the one end side and the other end side of the frame body, it is possible to enhance the bondability between the one end side and the other end side. In addition, a vertical misalignment between the one end side and the other end side of the frame body can be suppressed.

Moreover, in a case where a joining material is continuously interposed in both of the juncture of the frame body and a region between the outer peripheral surface of the optical fiber securing member, and the one end side and the other end side, concentration of a stress or the like resulting from the difference in thermal expansion coefficient among the frame body, the optical fiber securing member, and the joining material on part of the joining material is suppressed.

Moreover, in a case where a part of the juncture of the frame body which extends from the through hole toward the base body is longer than a part of the juncture of the frame body which is located above the through hole, during the manufacturing process of the package for housing an optical semiconductor element, the joining material placed between the frame body and the seal ring spreads out readily from a portion of the juncture located above the through hole to a portion of the juncture extending from the through hole toward the base body through the region between the outer peripheral surface of the optical fiber securing member, and the one end side and the other end side. As a result, the bondability between one end and the other end of the frame body, and the bondability between the outer peripheral surface of the optical fiber securing member, and the one end and the other end may be improved.

Moreover, in a case where a marking indicating a position coinciding with the juncture is provided on the outer peripheral surface of the optical fiber securing member, this makes it easy to mount the optical fiber securing member in a position at a desired turning angle with respect to the center axis of the through hole.

Moreover, in a case where a seal ring is joined to the upper surface of the frame body, it is possible to maintain the hermeticity of the optical semiconductor device with ease, because a gap is less prone to be developed between the frame body and the seal ring.

Moreover, since a groove which straddles the juncture is provided in the part of the seal ring which part is bonded to the juncture, it is possible to strengthen the bonding between the frame body and the seal ring at the position of the juncture.

The optical semiconductor device in accordance with one embodiment of the invention comprises: the package for housing an optical semiconductor element having the above-described structure; an optical semiconductor element mounted on the mounting portion; and a lid body attached to the upper surface of the frame body so as to close the interior of the frame body. Accordingly, it is possible to provide an optical semiconductor device which is less prone to a connection failure at the juncture of the frame body, exhibits excellent sealing performance capability, and is capable of operating an optical semiconductor element normally with stably for a long period of time.

BRIEF DESCRIPTION OF DRAWINGS

FIG. 3B is a sectional view taken along the line A-A shown in FIG. 3A.

DESCRIPTION OF EMBODIMENTS

Figure 1:
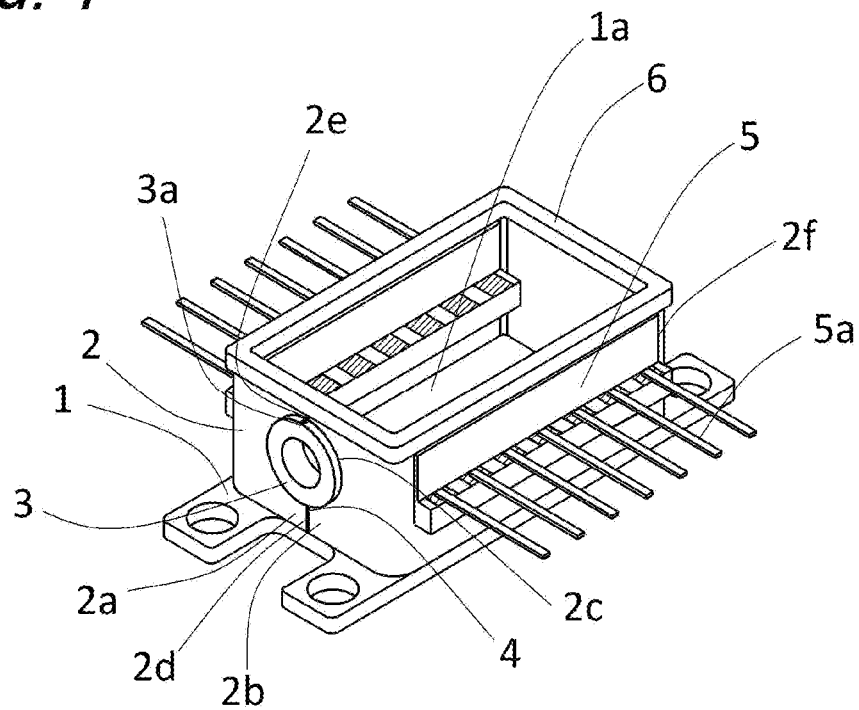
FIG. 1 is a perspective view showing an example of a package for housing an optical semiconductor element according to an embodiment of the invention.
Figure 2A:
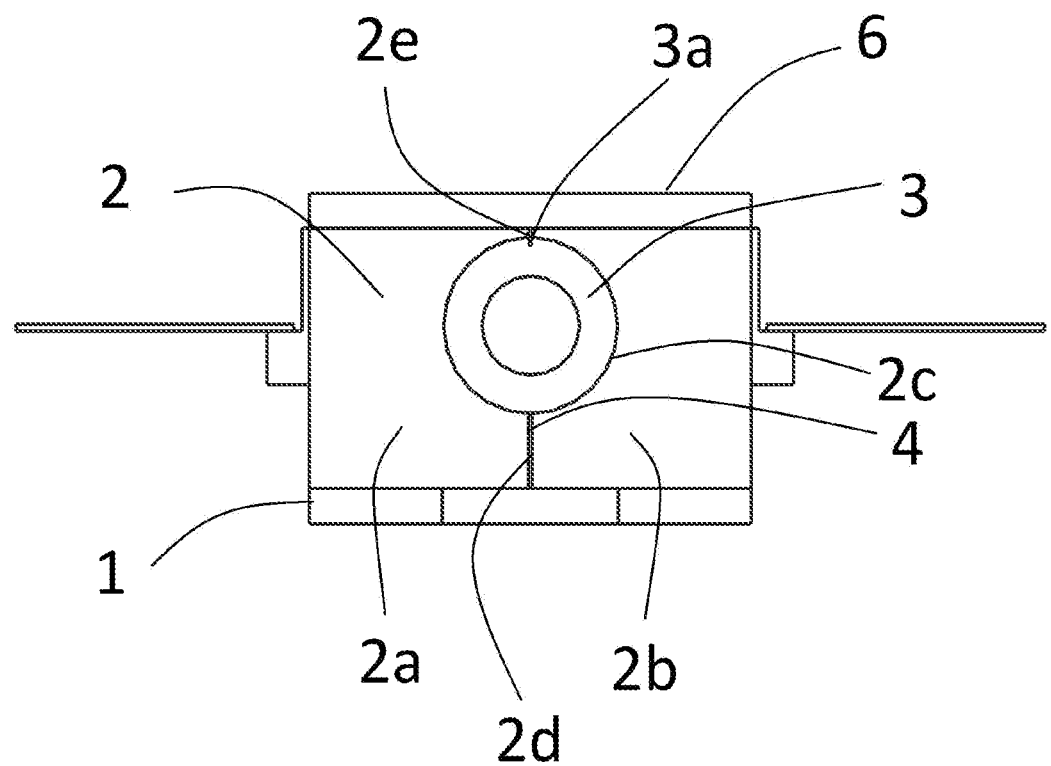
FIG. 2A is a side view of the package for housing an optical semiconductor element shown in FIG. 1.

A package for housing an optical semiconductor element according to the invention will hereafter be described in detail. FIG. 1 is a perspective view showing an example of the package according to an embodiment of the invention. Moreover, FIG. 2A is a side view of the package shown in FIG. 1. In these figures, reference numeral 1 represents a base body, reference numeral represents a frame body, and reference numeral 3 represents an optical fiber securing member.

As shown in FIGS. 1 and 2A, the package in accordance with one embodiment of the invention comprises: a metal-made base body 1 which has, on its upper main surface, a mounting portion 1a where an optical semiconductor element is mounted; and a frame body 2 in the form of, for example, a rectangular frame, joined to the upper main surface of the base body 1 so as to surround the mounting portion 1a. Moreover, the frame body 2 has, on its one side face, a through hole 2c for securing an optical fiber securing member 3, and, the optical fiber securing member 3 is fixedly inserted in the through hole 2c.

The frame body 2 is fabricated by bending a slim rectangular metal plate at its four positions, for example, at right angles, and then bonding one end 2a and the other end 2b thereof together in a position on one flat sidewall of the frame body 2 excluding the resultant bends. Thus, the frame body 2 is not fabricated by machining a metal ingot into a frame form for example, but is fabricated simply by bending a slim metal plate, wherefore wasted metal chippings will not be produced, and also there is no need to take much time for working process, and consequently, the frame body 2 can be easily manufactured in an economical way.

The frame body 2 is provided with, on its one end side 2a, a cutaway which constitutes a part of the through hole 2c. Meanwhile, the other end side 2b of the frame body 2 is also provided with a cutaway which constitutes a part of the through hole 2c, so that the cutaway of the one end side 2a and the cutaway of the other end side 2b combine to make the through hole 2c. Then, when the one end side 2a and the other end side 2b are butted, the frame body 2 with the through hole 2c provided at a position of the juncture of these sides is formed.

The optical fiber securing member 3 is a cylindrical member for securing an optical fiber from outside the package. After a metal fitting fixed to the tip of the optical fiber, the metal fitting is adjusted its position so that the optical semiconductor element mounted inside the package and the optical fiber can be optically coupled to each other, then the metal fitting is fixed by means of welding or otherwise to the optical fiber securing member 3, whereby an optical signal outputted from the optical semiconductor element mounted inside the package, or an optical signal inputted to the optical semiconductor element can be transmitted via the optical fiber.

In order to hermetically seal the inside of the package from the outside, glass, sapphire glass, or other crystalline substance transparent to optical signals is disposed on an end face of the cylindrical optical fiber securing member 3 of the inner side of the package.

Then, the optical fiber securing member 3 is fitted in the through hole 2c of the frame body 2, and, joining at a region between the one end side 2a and the other end side 2b of the frame body 2, a region between the outer peripheral surface of the optical fiber securing member 3 and the one end side 2a, and a region between the outer peripheral surface of the optical fiber securing member 3 and the other end side 2b are weld by means of a joining material 4 such as a brazing material. In this way, the frame body 2 fitted with the optical fiber securing member 3 is fabricated.

In such a frame body 2, in addition to the juncture of the one end side 2a and the other end side 2b, joining using the joining material 4 is performed so as to go around the optical fiber securing member 3, wherefore the length joined using the joining material 4 can be lengthened. This helps increase the Mining strength. For example, in the manufacturing process of the package for housing optical semiconductor element, the frame body 2 suffers from warpage or distortion due to the difference in thermal expansion coefficient between itself and the base body 1 or an input-output terminal 5 and consequently a force is exerted on the juncture of the frame body 2 in a compression direction or a tensile direction. Even in such a situation, the joining portion of the frame body 2 can be maintained.

As a result, for example, in the manufacturing process of the package for housing optical semiconductor element, the joining of the opposite ends 2a and 2b becomes resistant to disconnection. Moreover, since the opposite ends 2a and 2b are bonded together via the optical fiber securing member 3, it is possible to decrease the possibility that the one end 2a and the other end 2b are staggered with respect to each other in a vertical direction and consequently joining operation is carried out in the frame body 2 without its upper and lower surfaces left stepped.

As a result, for example, in the manufacturing process of the package for housing optical semiconductor element and the optical semiconductor device, when the base body 1, a seal ring 5, and a lid body are joined to the frame body 2, it is less possible of a sealing failure resulting from the absence of the joining material 4 in the shoulders created by the stepped configurations of the upper and lower surfaces of the frame body 2. Moreover, it is less possible that the base body 1, the seal ring 5, or the lid body is joined tilted to the frame body 2.

Since the optical fiber securing member 3 is fixed in the through hole 2c formed at the juncture, there is no need to form extra through hole in the frame body 2. Moreover, it is not necessary to join the optical fiber securing member 3 to a position of the frame body 2 in a different process other than the process of joining the juncture of the one end side 2a and the other end side 2b of the frame body 2. In conventional cases, the frame body 2 was worked on to form therein a through hole for the single purpose of securing the optical fiber securing member 3, and, the optical fiber securing member 3 was bonded into the through hole dedicated to secure the optical fiber securing member 3.

In a case where the optical fiber securing member 3 is cylindrically shaped and the through hole 2c is circularly shaped, the juncture of the ends 2a and 2b is defined by a curved surface without a corner, wherefore the joining material 4 such as a brazing material is allowed to flow easily through the juncture. This makes it possible to provide the joining material 4 in uniform width with ease, and thereby achieve uniformity in joining strength.

Moreover, in a case where the joining material 4 existing between the one end 2a and the other end 2b and the joining material 4 existing between the outer peripheral surface of the optical fiber securing member 3, and the one end 2a and the other end 2b are formed integrally with each other, it never occurs that a joining interface is formed in a gap of discontinuity in the joining material 4. Therefore, a force is concentrated on the joining interface, with consequent resistance to disconnection. As a result, the joining of the opposite ends 2a and 2b become resistant to disconnection, wherefore the airtightness of the package for housing an optical semiconductor element can be enhanced.

Moreover, it never occurs that a stress resulting from the difference in thermal expansion coefficient among the frame body 2, the optical fiber securing member 3, and the joining material 4 is concentrated on a part of discontinuity in the joining material 4. As a result, for example, in the manufacturing process of the package for housing an optical semiconductor element, the joining of the opposite ends 2a and 2b can become resistant to disconnection.

Here, as shown in FIGS. 1 and 2A, when, of junctures 2d and 2e of the one end 2a and the other end 2b, the base body 1-sided juncture 2d located below the through hole 2c is made longer than the juncture 2e located at an upper part of the frame body 2 so as to lie above the through hole 2c, then, for example, in the manufacturing process of the package for housing an optical semiconductor element, the joining material 4 disposed between the frame body 2 and the seal ring 6 will spreads out readily from the upper juncture 2e to the lower juncture 2d through the region between the outer peripheral surface of the optical fiber securing member 3, and the one end side 2a and the other end side 2b. As a result, the bondability between the one end side 2a and the other end 2b of the frame body 2, and the bondability between the outer peripheral surface of the optical fiber securing member 3, and the one end 2a and the other end 2b are enhanced.

Moreover, with the provision of a marking 3a indicating a position coinciding with the juncture 2e, 2d of the frame body 2 on the outer peripheral surface of the optical fiber securing member 3, a misalignment of the marking 3a relative to the juncture 2e, 2d can be identified. This makes it possible to mount the optical fiber securing member 3 in a position at a desired turning angle with respect to the center axis of the through hole 2c.

Figure 2B:
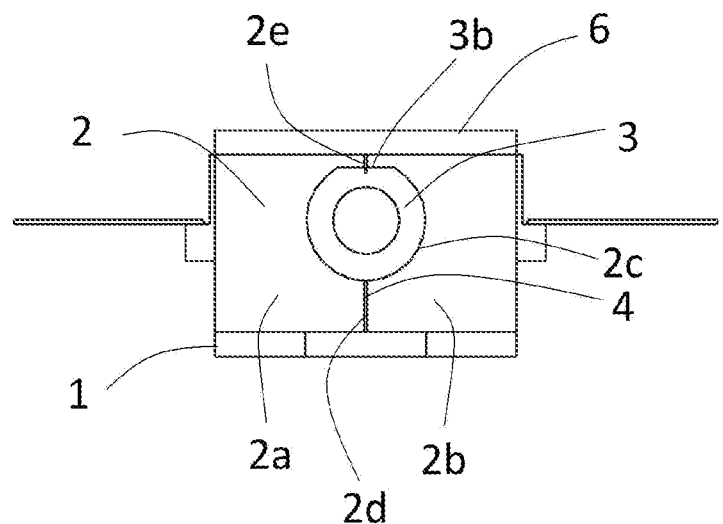
FIG. 2B is a side view showing another example of the package for housing an optical semiconductor element according to the embodiment of the invention.
Figure 2C:
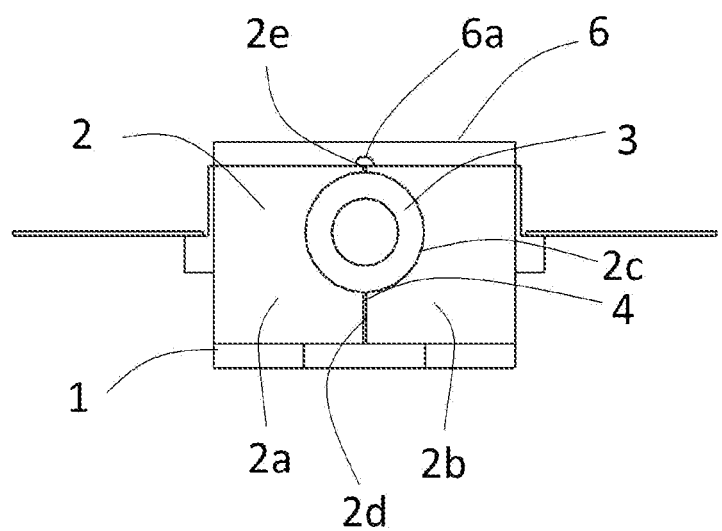
FIG. 2C is a side view showing still another example of the package for housing an optical semiconductor element according to the embodiment of the invention.
Figure 3A:
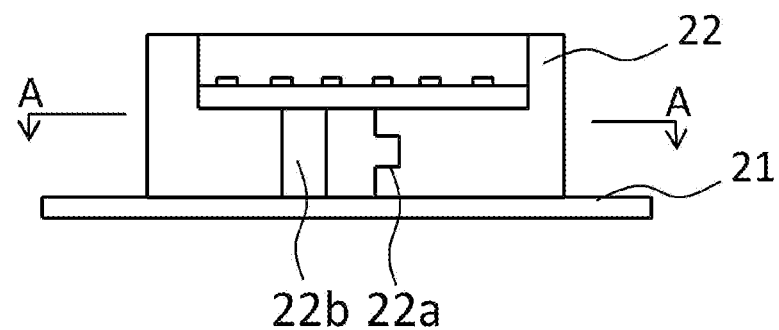
FIG. 3A is a front view showing an example of a conventional package for housing an optical semiconductor element.

The marking 3a is made by, for example, drawing a groove or line parallel to the center axis of the optical fiber securing member 3 on the outer peripheral surface of the optical fiber securing member 3. Alternatively, the marking 3a can be obtained by making a change to the shape of the outer peripheral surface of the optical fiber securing member 3. For example, as shown in FIG. 2B, the marking 3a can be obtained by forming a flat area 3B at part of the outer peripheral surface of the optical fiber securing member 3. In addition, the marking 3a may be made by drawing a groove or line parallel to the center axis of the optical fiber securing member 3 on the flat area 3B.

By forming the flat area 3B on the outer peripheral surface so as to be situated on the upper or lower surface coinciding with the juncture 2e, 2d of the frame body 2, it is possible to reduce the height of the optical fiber securing member 3, and thereby reduce the height of the package for housing an optical semiconductor element.

The base body 1 of the invention is made of a metal or an insulator, for example, a Fe (iron)-Ni (nickel)-Co (cobalt) alloy, a Fe—Ni alloy, a Cu-based material such as a Cu (copper)-W (tungsten) composite material or a Cu—Mo (molybdenum) composite material, Cu, or an alloy predominantly composed of Cu. It is particularly desirable to use a Cu-based material from the viewpoint of improving the thermal conductivity of the base body 1 for efficient dissipation of heat generated from an internally mounted optical semiconductor element in an operating condition to outside. Ceramics having excellent thermal conductivity may be used.

Such a base body 1 is fabricated by the working of a metal ingot into a predetermined shape through a heretofore known metalworking process such as a rolling process or punching process. The mounting portion 1a for mounting an optical semiconductor element is located in a center region of the upper main surface of the base body 1. The mounting portion 1a is a place where an optical semiconductor element is mounted. The base body 1 serves also as a heat-dissipating plate for dissipating heat generated from an optical semiconductor element in an operating condition to outside.

There may be cases where a base support is mounted on the upper main surface of the mounting portion 1a, and an optical semiconductor element is mounted on the base support. The base support is made of an insulator such as an alumina ($Al_2O_3$) sintered compact, an aluminum nitride (AlN) sintered compact, or a mullite ($3Al_2O_3.2SiO_2$) sintered compact, and performs the function of providing electrical isolation between the base body 1 and an optical semiconductor element.

Moreover, the metal-made frame body 2 is disposed in upstanding condition around the mounting portion 1a on the upper main surface of the base body 1 so as to surround the mounting portion 1a via a brazing material such as Ag (silver) solder or Ag—Cu solder. The frame body 2 is provided with a mounting part 2f for the installation of the input-output terminal 5 for providing electrical continuity between the interior of the package and the exterior thereof, and, the input-output terminal 5 is attached to the mounting part 2f. The frame body 2 plays, in conjunction with the base body 1, the role of constituting a cavity for housing therein an optical semiconductor element.

The frame body 2 is made of a metal such as a Fe—Ni—Co alloy or a Fe—Ni alloy, and is fabricated by subjecting a metal ingot to a rolling process, and thereafter shaping the rolled product into a slim strip-like plate through a heretofore known metalworking process such as a machining process or punching process. In the metal plate cut into predetermined dimensions that constitutes the frame body 2, it is advisable to create a groove on one main surface of a part of the metal plate which is to be bent so as to extend from the upper end to the lower end thereof, so that the metal plate can be folded along the groove. Note that an insulator such as resin can be used for the frame body 2.

One end 2a and the other end 2b of the frame body 2 are butted, and the optical fiber securing member 3 is inserted into the resultant through hole 2c, and, after a brazing material preform is interposed between the base body 1 and the seal ring 6, and/or between the base body 1 and the frame body 2, they are put in a brazing-material melting furnace. In this way, the molten brazing material flows into, in addition to the region between the base body 1 and the frame body 2, and/or the region between the base body 1 and the seal ring 6, the juncture of the butted one and the other ends 2a and 2b of the frame body 2, whereby it is possible to join not only the base body 1, the frame body 2 and the seal ring 6 but also the joining portion of the opposite ends 2a and 2b of the frame body 2 and the optical fiber securing member 3 at the same time.

Ceramics such as an $Al_2O_3$ sintered compact, an AlN sintered compact, or a $3Al_2O_3.2SiO_2$ sintered compact, or other insulator is attached to the mounting part 2f for the input-output terminal 5. For example, in a case where the insulator of the mounting part 2f is made of an $Al_2O_3$ sintered compact, appropriate organic binder, organic solvent, plasticizer, dispersant, and so forth are admixed in powder of raw materials such as $Al_2O$, $SiO_2$, MgO, and CaO in order to prepare a slurry, and the slurry is shaped into a sheet or the like form by a heretofore known molding technique.

Next, a conductor paste, which is prepared by mixing appropriate binder and solvent with powder of metal such as W, Mo, or Mn, is print-coated onto locations of the sheet that become a line conductor of the input-output terminal 5 and the outer side face thereof to be attached to the mounting part 2f, thereby forming the line conductor and a metal layer for bonding of a brazing material. After that, the thus obtained ceramic molded body is cut into predetermined dimensions, and is lastly fired at a temperature of about 1600° C., whereupon a sintered body which constitutes the input-output terminal 5 can be produced. A lead terminal 5a made of a metal such as a Fe—Ni—Co alloy is joined to the line conductor provided in the input-output terminal 5 via a brazing material such as Ag solder or Ag—Cu solder. Then, the input-output terminal 5 is fitted to the mounting part 2f of the frame body 2 and bonded thereto via a brazing material such as Ag solder or Ag—Cu solder.

The lead terminal 5a is electrically connected to an external electric circuit (not shown). The lead terminal 5a drives an optical semiconductor element by transmitting an electric signal supplied from the external electric circuit to the optical semiconductor element, and also effects inputting and outputting of a signal between the optical semiconductor element and the external electric circuit. Preferably, the lead terminal 5a may be attached to a side wall where the bonding of the one end 2a and the other end 2b of the frame body 2 is not effected.

Then, after an optical semiconductor element is fixedly mounted on the mounting portion 1a of the package having the structure thus far described, electrical connection is established between the line conductor of the input-output terminal 5 situated inside the frame body 2 while making electrical connection with the lead terminal 5a and an electrode of the optical semiconductor element by a bonding wire or the like, and subsequently a lid body made of a metal such as a Fe—Ni—Co alloy or ceramics is attached to the upper surface of the frame body 2 by means of soldering, welding, or otherwise, so that the optical semiconductor element can be hermetically sealed. Thus, an optical semiconductor device can be constructed as a commercial product.

According to the optical semiconductor device in accordance with one embodiment of the invention, by the use of the package having the above-described structure, the frame body 2 can be easily formed in an economical way. Moreover, the use of the package having the above-described structure makes it possible to exhibit excellent sealing performance capability at the juncture of the opposite ends 2a and 2b of the frame body 2, and thereby operate the optical semiconductor element normally with stably for a long period of time. Then, the use of the package having the above-described structure makes it possible to produce an optical semiconductor device having high reliability in the operation of an optical semiconductor element.

To the upper surface of the frame body 2 may be attached a seal ring 6 which is made of a metal such as a Fe—Ni—Co alloy or a Fe—Ni alloy, and is fabricated by subjecting a metal ingot to a rolling process, and thereafter shaping the rolled product into a frame-like form through a heretofore known metalworking process such as a machining process or punching process. In this case, the lid body may be joined to the upper surface of the seal ring 6. The seal ring 6 is used on an as needed basis, and is therefore not an essential component.

In the case of bonding the seal ring 6 to the upper surface of the frame body 2, the joining material 4 provided between the upper surface of the frame body 2 and the seal ring 6 flows into and fills a recess or stepped part which is created at the upper end of the juncture 2e of the one end side 2a and the other end side 2b of the frame body 2. As a result, a gap is less prone to be developed between the upper surface of the frame body 2 and the seal ring 6, wherefore the airtightness of the package is maintained. Moreover, the bondability between the frame body 2 and the lid body can be enhanced with the interposition of the seal ring 6 between them.

Moreover, it is preferable that a groove 6a is provided on the lower surface of one side of the seal ring 6 located at the juncture 2e of the one end side 2a and the other end side 2b of the frame body 2 extending along the joining of the one end side 2a and the other end side 2b. The groove 6a is created so as to straddle the juncture 2e which is the joining interface, on the lower surface of the seal ring 6. The groove 6a is created between the inner peripheral surface and the outer peripheral surface of the seal ring 6. This makes it possible to recognize a misalignment between the upper juncture 2e of the frame body 2 and the groove 6a as well as the seal ring 6. Moreover, the joining material 4 flowing into the groove 6a helps increase the joining strength between the upper end of the juncture of the one end side 2a and the other end side 2b of the frame body 2 and the seal ring 6.

In explaining a representative embodiment of the above-described package, constituent members and the dimensions thereof will hereafter be described. Note that they are described merely by way of example, and the invention is thus not limited to the embodiment as set forth hereunder.

The base body 1 was fabricated by punching out a metal plate made of a Cu—W composite material into a shape which is 21 mm in length, 13 mm in width, and 1 mm in thickness, with a screw mounting portion at each short side. In fabricating the frame body 2, a metal plate made of a Fe—Ni—Co alloy which is 68 mm in length, 9 mm in width, and 1 mm in thickness was punched out into a shape having a cutaway for constituting the through hole 2c at each of its opposite ends 2a and 2b. Then, the plate was bent at its four positions to fabricate a rectangular frame body 2 having outer dimensions of 21 mm in length by 13 mm in width as seen in a plan view.

The optical fiber securing member 3 was fabricated by machining a Fe—Ni—Co alloy material. Moreover, the seal ring 6 was fabricated by punching out a metal plate made of a Fe—Ni—Co alloy into the shape of a frame which is 21 mm in length, 13 mm in width, 1 mm in thickness, 19 mm in inner length, and 11 mm in inner width as seen in a plan view.

The input-output terminal was formed of an $Al_2O_3$ sintered compact.

After these members were combined together, a brazing material preform made of Ag—Cu solder was interposed between the base body 1 and the frame body 2, and between the frame body 2 and the seal ring 6, and, the members were joined to one another by causing the brazing material to melt in a furnace at a temperature of about 800° C.

The lid body was fabricated by punching out a metal plate made of an iron-nickel-cobalt alloy into a rectangular shape which is 21 mm in length, 13 mm in width, and 1 mm in thickness, and, after an electronic component was mounted inside the package, the lid body was joined to the upper surface of the seal ring 6 by means of seam welding or via a brazing material.

It should be understood that the invention is not limited to the embodiments described hereinabove, and therefore various changes and modifications are possible without departing from the scope of the invention. For example, in the above-described embodiment, as the joining material 4, a resin adhesive or other type of joining material instead of a brazing material.

Moreover, although the junctures 2d and 2e are illustrated as extending in a straight line in the vertical direction, they may extend in a slanting direction, and they do not necessarily have to extend in a straight line. In this case, the joining distance can be lengthened even further.

REFERENCE SIGNS LIST

1: Base body
1a: Mounting portion
2: Frame body
2a: One end
2b: Other end
2c: Through hole
2d: Juncture (lower side or base body-side)
2e: Juncture (upper side)
2f: Mounting part
3: Optical fiber securing member
4: Joining material
5: Input-output terminal
6: Seal ring

The invention claimed is:

1. A package for housing an optical semiconductor element, comprising:
 a base body having an optical semiconductor element mounting portion on an upper main surface thereof;
 a frame body joined to the base body so as to surround the mounting portion;
 an optical fiber securing member fitted in a through hole which penetrates through the frame body,
 the frame body being formed by bending a single strip-like plate member at its several positions, and then bonding one end side and an other end side thereof,
 the through hole being provided so as to be located at a juncture of the one end side and the other end side, and
 a marking indicating a position coinciding with the juncture being provided on the outer peripheral surface of the optical fiber securing member.

2. The package for housing an optical semiconductor element according to claim 1,
 wherein a joining material is continuously interposed in both of the juncture of the frame body and a region between an outer peripheral surface of the optical fiber securing member, and the one end side and the other end side.

3. The package for housing an optical semiconductor element according to claim 1,
 wherein a part of the juncture of the frame body which extends from the through hole toward the base body is longer than a part of the juncture of the frame body which is located above the through hole.

4. The package for housing an optical semiconductor element according to claim 1, wherein a seal ring is joined to an upper surface of the frame body.

5. The package for housing an optical semiconductor element according to claim 4,
wherein a groove which straddles the juncture is provided in a part of the seal ring which part is bonded to the juncture.

6. An optical semiconductor device, comprising:
the package for housing an optical semiconductor element according to claim 1;
an optical semiconductor element mounted on the mounting portion; and
a lid body attached to an upper surface of the frame body so as to close an interior of the frame body.

7. A package for housing an optical semiconductor element, comprising:
a base body having an optical semiconductor element mounting portion on an upper main surface thereof;
a frame body joined to the base body so as to surround the mounting portion; and
an optical fiber securing member fitted in a through hole which penetrates through the frame body,
the frame body being formed by bending a single strip-like plate member at its several positions, and then bonding one end side and an other end side thereof,
the through hole being provided so as to be located at a juncture of the one end side and the other end side,
a seal ring being joined to an upper surface of the frame body,
a groove which straddles the juncture being provided in a part of the seal ring which part is bonded to the juncture.

\* \* \* \* \*